United States Patent [19]
Short et al.

[11] Patent Number: 5,334,273
[45] Date of Patent: Aug. 2, 1994

[54] WAFER BONDING USING TRAPPED OXIDIZING VAPOR

[75] Inventors: John P. Short, Indian Harbor Beach; Craig J. McLachlan, Melbourne; George V. Rouse, Indialantic; James R. Zibrida, Melbourne, all of Fla.

[73] Assignee: Harris Corporation, Melbourne, Fla.

[21] Appl. No.: 137,293

[22] Filed: Oct. 14, 1993

Related U.S. Application Data

[63] Continuation of Ser. No. 834,439, Feb. 12, 1992, Pat. No. 5,266,135, which is a continuation of Ser. No. 781,686, Oct. 24, 1991, abandoned, which is a continuation of Ser. No. 476,322, Feb. 7, 1990, abandoned.

[51] Int. Cl.$^5$ .............................. B32B 31/24
[52] U.S. Cl. ..................... 156/87; 148/DIG. 135; 437/62; 437/86
[58] Field of Search ................ 156/89, 87, 314, 662; 437/31, 62, 86, 205, 208, 228, 238, 920, 940, 952, 968, 979; 148/DIG. 12

[56] References Cited

U.S. PATENT DOCUMENTS

| | | | |
|---|---|---|---|
| 2,974,075 | 3/1961 | Miller | 156/662 |
| 3,239,908 | 3/1966 | Makamura | 437/208 |
| 3,689,357 | 9/1972 | Jordan | 156/662 |
| 4,638,552 | 1/1987 | Shimbo et al. | 148/DIG. 12 |
| 4,738,935 | 4/1988 | Shimbo et al. | 437/31 |
| 4,854,986 | 8/1989 | Rabey | 156/87 |
| 4,883,215 | 11/1989 | Geosele et al. | 148/DIG. 12 |
| 4,962,062 | 10/1990 | Uchiyama et al. | 148/DIG. 12 |
| 5,131,968 | 7/1992 | Wells et al. | 156/87 |
| 5,266,135 | 11/1993 | Short et al. | 156/87 |

OTHER PUBLICATIONS

"Silicon-to-Silicon direct bonding method" Shimbo et al, J. Appl. Phys. 60, Oct. 15, 1986, pp. 2987 & 2988.

*Primary Examiner*—Caleb Weston
*Attorney, Agent, or Firm*—Nixon, Hargrave, Devans & Doyle

[57] ABSTRACT

A bonding method including pressing a pair of slices together with a liquid oxidant therebetween and subjecting the pair of slices to a temperature to bond the slices together. Preferably a liquid oxidant is applied to one of the slices before they are pressed together and then dried. The heating step for bonding is carried out at a sufficiently high temperature of at least 1100° C. to make the slices pliable so as to comply with each other during the bonding step.

23 Claims, 1 Drawing Sheet

PROCESS

A. PREPARE SLICES

B. OXIDIZE BONDING SURFACE OF ONE SLICE

C. TREAT BONDING SURFACES WITH ACID

D. APPLY LIQUID OXIDANT TO A BONDING SURFACE

E. PRESS SLICES TOGETHER AND DRY

F. HEAT SLICES TO BOND

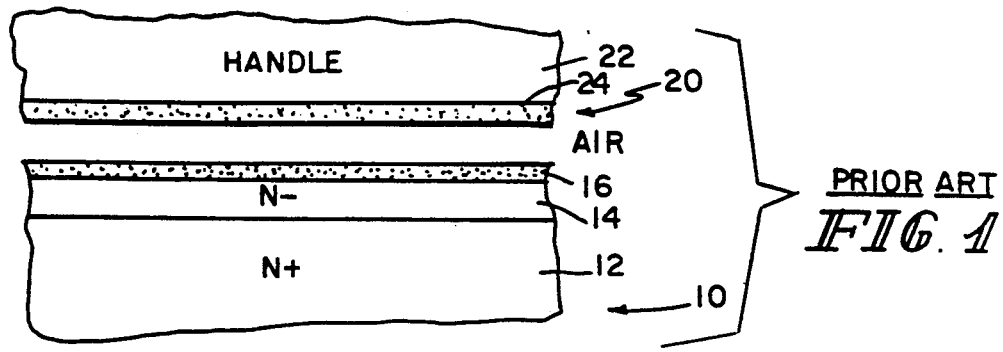
PRIOR ART
FIG. 1
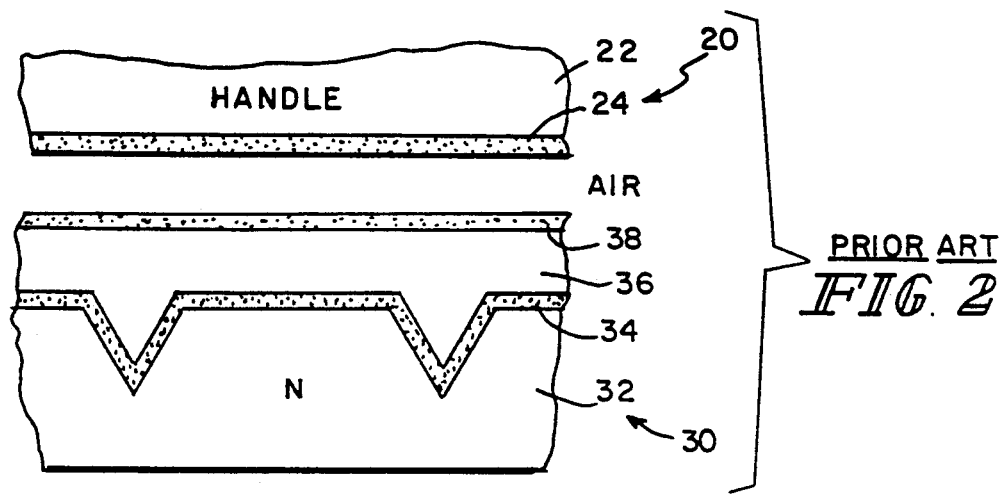
PRIOR ART
FIG. 2
PROCESS
A. PREPARE SLICES
B. OXIDIZE BONDING SURFACE OF ONE SLICE
C. TREAT BONDING SURFACES WITH ACID
D. APPLY LIQUID OXIDANT TO A BONDING SURFACE
E. PRESS SLICES TOGETHER AND DRY
F. HEAT SLICES TO BOND
FIG. 3

WAFER BONDING USING TRAPPED OXIDIZING VAPOR

This is a continuation of Ser. No. 834,439, filed Feb. 12, 1992, now U.S. Pat. No. 5,266,135 which is a continuation of application Ser. No. 781,686, filed Oct. 24, 1991, abandoned, which is a continuation of application Ser. No. 476,322, filed Feb. 7, 1990, abandoned.

BACKGROUND AND SUMMARY OF THE INVENTION

The present invention relates generally to bonded wafers and more specifically to an improved method of wafer bonding.

Wafer bonding is a technique widely used as a processed step in fabricating SOI (silicon on insulator) and DI (dielectric isolation) in an integrated circuit structure. The starting material is on one slice and is to be bonded to a handle on a second slice. At least one if not both of the bonding surfaces of the two slices has thermally grown oxide thereon. The two prepared slices are put together in the presence of air and heated at a certain temperature, generally above 1000°, to accomplish bonding. This may be performed in an oxidizing atmosphere if preferred.

During further processing of the wafer by thinning one of the two slices, generally the non-handle slice, delamination occurs over part of the bonded surface. This delamination seems to be at least partially due to pitting over the bonding surface.

The prior art wafer bonding process has a high yield rate if the measure is only bonding of the wafers. If the measure is the percentage of surface area bonded, the yield is drastically reduced. The prior art 100% bonded surfaces have a yield of about 20%.

Thus it is an object of the present invention to provide a bonding process which removes pitting of the bonding surfaces.

Another object of the present invention is to eliminate nitrogen from the bonding surfaces prior to bonding so as to minimize pitting.

An even further object of the present invention is to maximize the formation of a vacuum and facilitate the compliance of the two bonding surfaces during bonding.

A still further object of the present invention is to increase the yield of 100% bonded wafers.

These and other objects of the present invention are attained by pressing a pair of slices together with a liquid oxidant there between and subjecting the pair of slices to a temperature to bond the slices together. Preferably a liquid oxidant is applied to one of the slices before they are pressed together to-form the substantially nitrogen free oxidant between the pressed slices. Preferably the oxidant is water or water in combination with hydrogen peroxide. The pair of slices with the oxidant there between is dried generally at room temperature in a pure oxygen or air atmosphere prior to the heating step which produces bonding. The bonding surfaces of the slices are treated with an acid to produce hydroxyl groups before applying the oxidant. Preferably only one of the bonding surfaces is oxidized prior to being pressed together. The heating step for bonding is carried out at a sufficiently high temperature of at least 1100° C. to make the slices pliable so as to comply with each other during the bonding step. By providing a liquid oxidant, oxidation is maximized and the vacuum produced by the depletion of the gaseous oxidant in combination with the pliable substrates produces the maximum conformance of the two slices. This improves the bonding process and protects against delamination.

Other objects, advantages and novel features of the present invention will become apparent from the following detailed description of the invention when considered in conjunction with the accompanying drawings.

BRIEF DESCRIPTION OF THE DRAWINGS

FIG. 1 is an illustration of a cross-sectional pair of slices to be joined for bonding in an SOI technique of the prior art;

FIG. 2 is a cross-section illustrating a pair of slices to be joined for bonding in a dielectric isolation technique of the prior art;

FIG. 3 is a flow diagram of the process according to the principles of the present invention.

DETAILED DESCRIPTION OF THE DRAWINGS

The SOI process of FIG. 1 includes slices 10 and 20 which are joined together in an air atmosphere and heated to produce bonding. The slice 10 includes an N+ region 12, an N− region 14 and an oxide layer 16. The slice 20 includes a handle 22 having an oxide layer 24. The slices 10 and 20 are brought together in air at the bonding surfaces 16 and 24 and heated sufficiently to produce bonding. This is generally in the 1000° C. range. During subsequent processing some or all of the layer 12 is removed by grinding and etching and subsequent layers are grown on the layer 14 as well as other process steps, to produce isolated islands on the oxide regions 16-24.

The formation of dielectrically isolated wells is illustrated in FIG. 2. The slice 30 includes an N region 32 having grooves formed therein and filled with the dielectric isolation layer 34. A support structure 36 generally of, for example, polysilicon is applied and planarized and an oxidized layer 38 is formed on the surface of 36. This is combined with the slice 20 which includes a handle 22 and an oxide surface 24. As in FIG. 1, the two slices 20 and 30 are combined at their bonding surfaces 24, 38 in air and heat is applied to produce bonding. During subsequent processing, the N layer 32 is reduced down sufficiently to expose the peaks of the dielectric isolation region 34 and forms dielectrically isolated regions therein. As in the process of FIG. 1, delamination occurs during the subsequent processing.

In both of the above processes of FIGS. 1 and 2, variations have been performed wherein not necessarily both the bonding surfaces have been oxidized. Also, others have reported that standard annealing step followed by a hyperbaric, high temperature annealing cycle reduces the bonding voids.

It is also known that during the heat bonding process, that the gaseous oxidant is depleted and forms a vacuum which pulls the two slices together. The present invention attempts to maximize the vacuum created, reduce pitting and provide a bonded product which will not delaminate during subsequent processing.

The present process is illustrated in the steps of FIG. 3 beginning in step A by preparing the slices as in FIG. 1 or 2 including regions 12, 14 and 22 and/or 32, 34 and 36. In step B, only one of the bonding surfaces is oxidized forming either oxide layer 24 and 16 or 24 and 38. While in the method of FIG. 1, the oxidation of one of the layers 16 or 24 is in the desired thickness range of the SOI insulative layer and the other a very thin layer generally in the range of 500 angstroms, the present invention is preferably performed wherein any oxidation on one of the slices is generally less than 50 angstroms. By providing an essentially non-oxidized surface as one of the bonding surfaces, oxidation occurs more quickly and thereby forms a stronger vacuum in the early stages of heating.

In step C, the bonding surfaces are treated with acid, for example, sulfuric/peroxide to form more of the hydroxyl group. The additional hydroxyl groups increase the amount of bonding as well as increases the hydrophilic characteristic of the bonding surface.

The two slices are brought together with a liquid oxidant there between. The oxidant should be substantially nitrogen free and should minimize the amount of gas between the slices. To achieve this as described in step D, the liquid oxidant is applied to one of the bonding surfaces. Then the slices are brought together at their bonding surfaces with the liquid oxidant minimizing the amount of air trapped between the slices. The pressed together slices are then allowed to dry generally at room temperature for a sufficient amount of time to evaporate the liquid oxidant. Preferably they are dried in a pure oxygen atmosphere in step E. A preferred oxidant application is to apply a drop of liquid on the surface of one of the slices generally in the range of 0.8 to 8.0 microliters per square inch. The preferred oxidants are water or water in combination with hydrogen peroxide.

As an example, 0.05 milliliters of 30% hydrogen peroxide was applied to a four inch wafer resulting in 4 microliters per square inch. The pressed together wafers were dried at room temperature for 24 hours. It has been found that if a majority of the liquid oxidant is not evaporated before the heating step, that the trapped oxidant explodes causing voids. Thus the liquid oxidant must keep gases from the bonding surface when they are pressed together and up to the heating step.

In step F, the pressed together pair of slices is then heated to bond. Preferably they are heated in an oxidizing atmosphere, for example, steam or wet oxygen at a temperature above 1000° C. Preferably the bonding is performed at a temperature sufficiently high to make the slices pliable such that the vacuum created by the depleting oxidant will allow the pliable substrates to conform to each other. Temperature for silicon is preferably above 1100° C. and is preferred at 1150° C. In the previous example, the wafer were heated at 1150° C. for 2 hours.

Water alone or water and hydrogen peroxide vapors between the bonding slices acts as an oxidizing agent. They are faster oxidizers than air or pure oxygen and therefore produce a more efficient vacuum when reacted with the slices. Use of liquid oxidant also eliminates the possibility of the deleterious effects of nitrogen or any gas and other pit forming impurities trapped between the slices. As previously discussed, by heating the slices at an elevated temperature to make the slices pliable allows the vacuum to more efficiently pull the slices together over the entire bonding surface. By only oxidizing one bonding surface, the non-bonding surface reacts more quickly with the trapped oxidant and thereby forms a stronger vacuum in the early stage of heating.

Resulting bond quality and overall bonding yield using the present technique is a substantial improvement over the prior art. Using prior art methods, 100% bonding yields are in the 20% range. Using the method of applying a liquid oxidant to the wafers prior to pressing together and then drying and heating produces a 100% bond yield in the 90% range.

Although the present invention has been described and illustrated in detail, it is to be clearly understood that the same is by way of illustration and example only, and is not to be taken by way of limitation. The process can also be used for wafer bonding where the bonding surfaces have not been substantially preoxidized. This is known as direct bonding. The spirit and scope of the present invention are to be limited only by the terms of the appended claims.

What is claimed is:

1. A method of forming bonded wafers from two slices comprising:
   pressing a pair of slices together at bonding surfaces with a predetermined quantity of oxidant therebetween; and
   heating said pair of slices to bond said slices together.

2. A method according to claim 1, wherein said oxidant is water.

3. A method according to claim 2 including treating said bonding surfaces of said slices with an acid to produce hydroxyl groups before applying said oxidant.

4. A method according to claim 1, wherein said oxidant is a mixture of water and hydrogen peroxide.

5. A method according to claim 1 including applying between 0.8 to 8.0 microliters per square inch of oxidant to a bonding surface of one of said slices before pressing.

6. A method according to claim 1 including drying said pressed pair of slices before heating.

7. A method according to claim 6 wherein said drying is performed in pure oxygen.

8. A method according to claim 6 wherein said drying is performed at room temperature.

9. A method according to claim 6 wherein said drying is performed until the predetermined quantity of oxidant has partially evaporated from between said bonding surface.

10. A method according to claim 1 wherein said heating is performed in an oxidizing atmosphere.

11. A method according to claim 1 wherein said heating is performed at a temperature of at least 1100° C.

12. A method according to claim 1 wherein one of said bonding surface of one of said slices is an oxidized surface and said bonding surface of the other slice is substantially non-oxidized prior to pressing together.

13. A method of forming a bonded wafer from a pair of slices comprising:
    applying a predetermined quantity of oxidant to a bonding surface of one of said slices;
    pressing said pair of slices together at said bonding surface with said oxidant therebetween; and
    heating said pair of slices at a temperature sufficient to make the slices pliable and for a sufficient time to bond the slices together.

14. A method according to claim 13, wherein said oxidant water.

15. A method according to claim 13 including treating said bonding surfaces of said slices with an acid to produce hydroxyl groups before applying said oxidant.

16. A method according to claim 13, wherein said oxidant is a mixture of water and hydrogen peroxide.

17. A method according to claim 13 including applying between 0.8 to 8.0 microliters per square inch of oxidant to a bonding surface of one of said slices before pressing.

18. A method according to claim 13 including drying said pressed pair of slices before heating.

19. A method according to claim 18 wherein said drying is performed in pure oxygen.

20. A method according to claim 18 wherein said drying is performed at room temperature.

21. A method according to claim 13 wherein said heating is performed in an oxidizing atmosphere.

22. A method according to claim 13 wherein said heating is performed at a temperature of at least 1100° C.

23. A method according to claim 13 wherein one of said bonding surface of one of said slices is an oxidized surface and said bonding surface of the other slice is substantially non-oxidized prior to pressing together.

* * * * *